United States Patent
Phlippoteau

(10) Patent No.: US 9,509,003 B2
(45) Date of Patent: Nov. 29, 2016

(54) BATTERY COMPRISING A PLURALITY OF ELECROCHEMICAL CELLS AND, FOR EACH CELL, A DEVICE FOR CONTROLLING THE VOLTAGE ACROSS THE TERMINALS OF SAID CELL

(71) Applicant: AREVA Stockage d'Energie, Aix en Provence (FR)

(72) Inventor: Vincent Phlippoteau, Aix en Provence (FR)

(73) Assignee: AREVA Stockage d'Energie, Aix en Provence (FR)

( * ) Notice: Subject to any disclaimer, the term of this patent is extended or adjusted under 35 U.S.C. 154(b) by 130 days.

(21) Appl. No.: 14/385,103

(22) PCT Filed: Mar. 14, 2013

(86) PCT No.: PCT/EP2013/055259
§ 371 (c)(1),
(2) Date: Sep. 12, 2014

(87) PCT Pub. No.: WO2013/135825
PCT Pub. Date: Sep. 19, 2013

(65) Prior Publication Data
US 2015/0086892 A1    Mar. 26, 2015

(30) Foreign Application Priority Data
Mar. 14, 2012  (FR) ...................... 12 52303

(51) Int. Cl.
*H01M 10/63*    (2014.01)
*H01M 8/04*     (2016.01)
*G01R 31/36*    (2006.01)

(52) U.S. Cl.
CPC ..... *H01M 8/04552* (2013.01); *H01M 8/04671* (2013.01); *H01M 8/04873* (2013.01); *H01M 8/04888* (2013.01); *G01R 31/3658* (2013.01); *Y02E 60/50* (2013.01)

(58) Field of Classification Search
CPC .................................................. H01M 10/4257
See application file for complete search history.

(56) References Cited

U.S. PATENT DOCUMENTS
6,628,120 B1    9/2003    Paul

FOREIGN PATENT DOCUMENTS
EP    0 982 788 A2    3/2000
EP    1 323 204 B1    5/2004
(Continued)

OTHER PUBLICATIONS
English translation of WO 0223658.*
(Continued)

*Primary Examiner* — Stewart Fraser
*Assistant Examiner* — Olatunji Godo
(74) *Attorney, Agent, or Firm* — Davidson, Davidson & Kappel, LLC

(57) ABSTRACT

A battery is provided. The battery includes a plurality of electrochemical cells connected in series with each other and adapted for each generating an electric current from an oxidation-reduction reaction between an oxidizing fluid and a reducing fluid. The battery also includes, for each electrochemical cell, a control device for controlling the voltage across the terminals of the cell. The battery also includes a voltage regulator device electrically connected to the cell so that the control device measures the voltage across the terminals of the cell, increased by an offset voltage across the terminals of the regulator device.

12 Claims, 4 Drawing Sheets

(56) References Cited

FOREIGN PATENT DOCUMENTS

Figure 1:
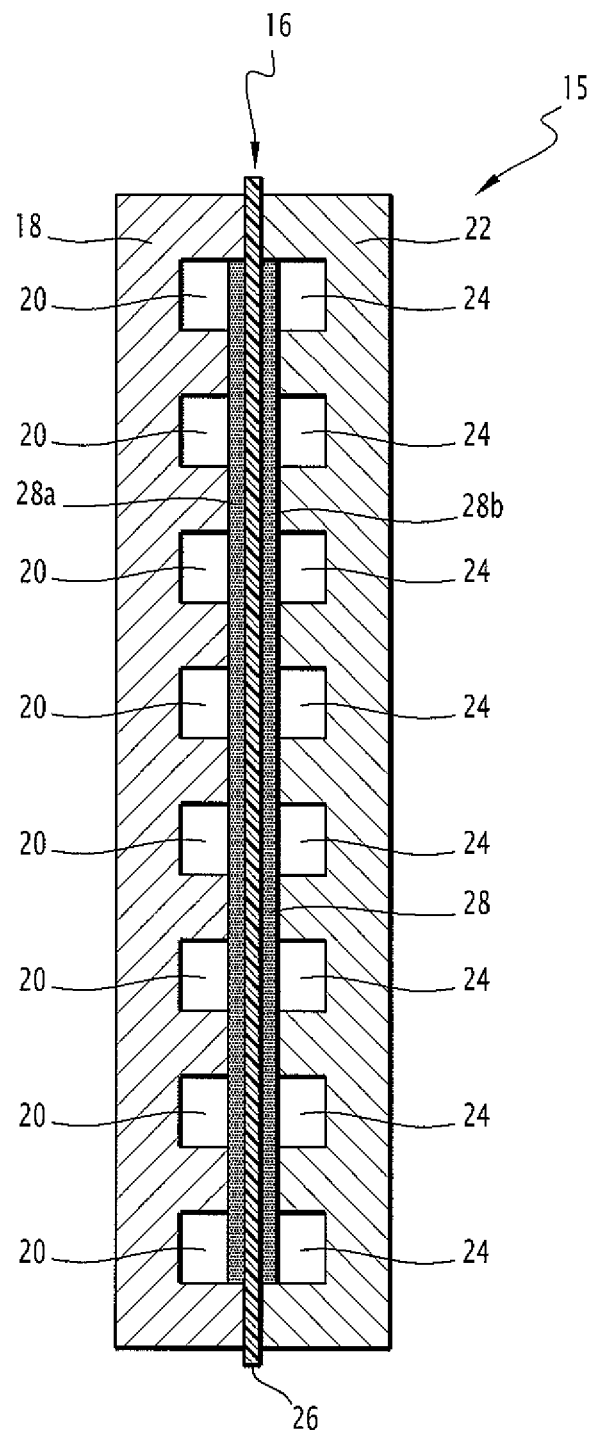

| WO | WO 02/23658 A1 | | 3/2002 |
|----|----------------|---|--------|
| WO | WO 0223658 | * | 3/2002 |

OTHER PUBLICATIONS

PCT Search Report for corresponding International PCT Application PCT/EP2013/55259.

* cited by examiner

BATTERY COMPRISING A PLURALITY OF ELECROCHEMICAL CELLS AND, FOR EACH CELL, A DEVICE FOR CONTROLLING THE VOLTAGE ACROSS THE TERMINALS OF SAID CELL

The present invention relates to a battery, of the type comprising a plurality of electrochemical cells, connected in series with each other and adapted for each generating an electric current from an oxidation-reduction reaction between an oxidizing fluid and a reducing fluid and for each electrochemical cell, to a device for controlling the voltage across the terminals of said cell.

BACKGROUND

Electrochemical cells are known, allowing electricity to be produced by an oxidation-reduction reaction between an oxidizing fluid and a reducing fluid. Notably, fuel cells are known allowing electricity to be produced by an oxidation-reduction reaction between a fuel, comprising hydrogen, and an oxidizer, comprising oxygen. The fuel is injected into an anode compartment and the oxidizer is injected into a cathode compartment, an electrolyte layer ensuring the seal between both of these compartments, allowing ion exchanges. Because of these ion exchanges, hydrogen contained in the fuel may react with the oxygen contained in the oxidizer giving water, by generating electrons at the anode. The result of this, during the operation of the fuel cell, is the establishment of a potential difference between both sides of the electrolyte, this potential difference may be utilized for generating an electric current.

However, the potential differences which are established within a cell of a fuel cell remain low, of the order of 0.6 to 1.0V. Also, in order to obtain a utilizable output voltage, the cells are most often stacked and electrically connected in series with each other, within what is currently called a fuel cell.

However, inside such a stack, it is important to control the proper operation of each cell independently of the operation of the other cells. Such an individual control of the cells actually gives the possibility of detecting a possible defect as early as possible, and of easily identifying the faulty cell in order to replace it.

EP 1 323 204 thus proposes a device for individually controlling the voltage of the cells of a fuel cell. This control device for each cell of the fuel cell comprises a resistor and an optocoupler connected in series to the terminals of the cell. An output signal of each optocoupler is adapted so as to establish a positive or negative voltage depending on whether the voltage on the input terminals of the optocoupler is greater or less than its threshold voltage, and to be transmitted to an interpretation unit which sends a dysfunction signal when one of the output signals has a negative voltage.

This control device has the advantage of being economical. However, it was observed that it signaled dysfunctions in an untimely manner, even when all the cells of the fuel cell were operating properly.

SUMMARY OF THE INVENTION

An object of the invention is to propose an inexpensive and reliable solution for controlling the voltage across the terminals of each electrochemical cell of a battery.

For this purpose, a battery is provided a voltage regulator device, electrically connected to said cell so that the control device measures the voltage across the terminals of the cell increased by an offset voltage across the terminals of the regulator device.

In preferred embodiments of the invention, the battery further has one or more of the following features, taken individually or according to all the technically possible combination(s):
- the offset voltage is set;
- the regulator device is a passive device, such as a diode;
- the regulator device is electrically connected through a first terminal, to a terminal of a consecutive cell of the battery, and to the cell whose voltage is measured, and, through a second terminal, to the other terminal of said consecutive cell;
- the first terminal of the regulator device is in a direct electric connection with the terminal common to the cell whose voltage is measured and to the consecutive cell;
- a resistor is electrically inserted between the second terminal of the regulator device and the terminal of the consecutive cell to which is connected said second terminal;
- the control device comprises an input connected to a terminal of the cell, the voltage of which is measured, on the one hand and to the second terminal of the regulator device on the other hand;
- the control device is an active optical element;
- the control device comprises an output for constructing an image of the measured voltage, the outputs of at least two of the control devices being a electrically connected in series with each other;
- the control device comprises an output for constructing an image of the measured voltage, the outputs of at least two of the control devices being electrically connected in parallel with each other;
- it is a fuel cell.

BRIEF SUMMARY OF THE INVENTION

Figure 2:
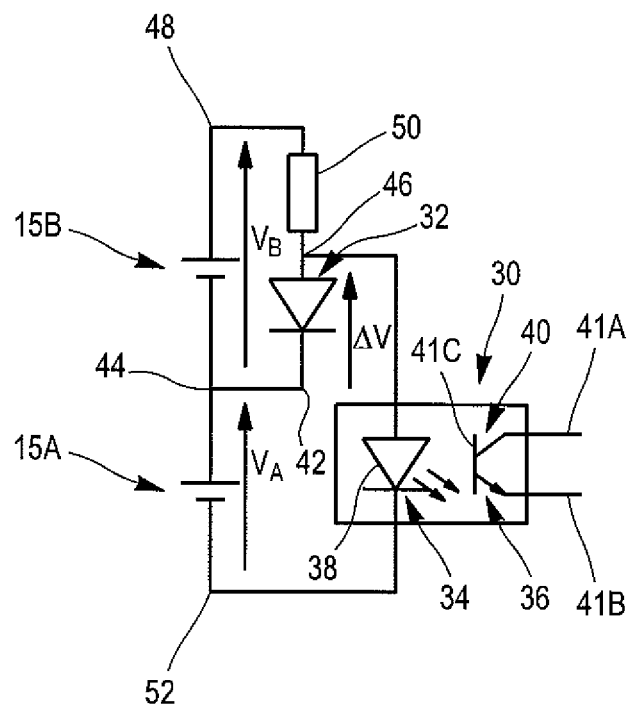
Figure 3:
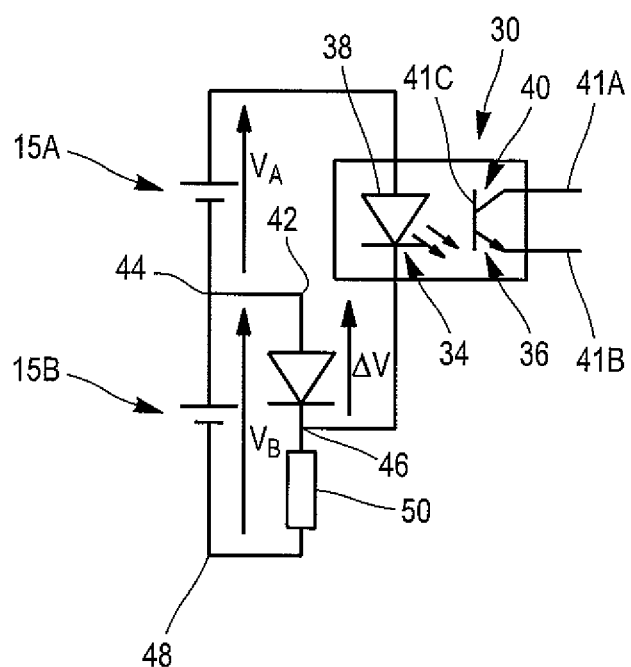
Figure 4:
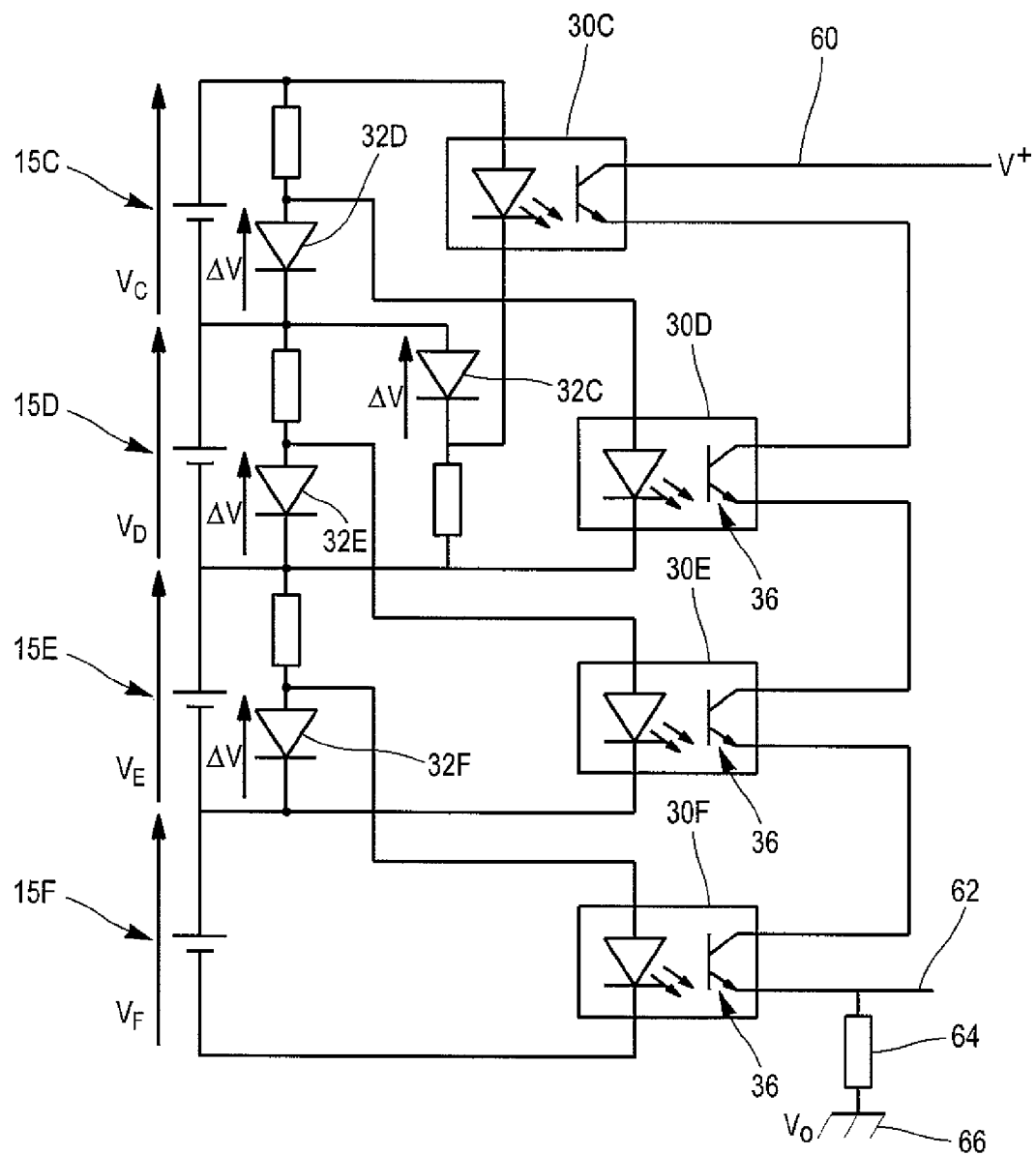
Figure 5:
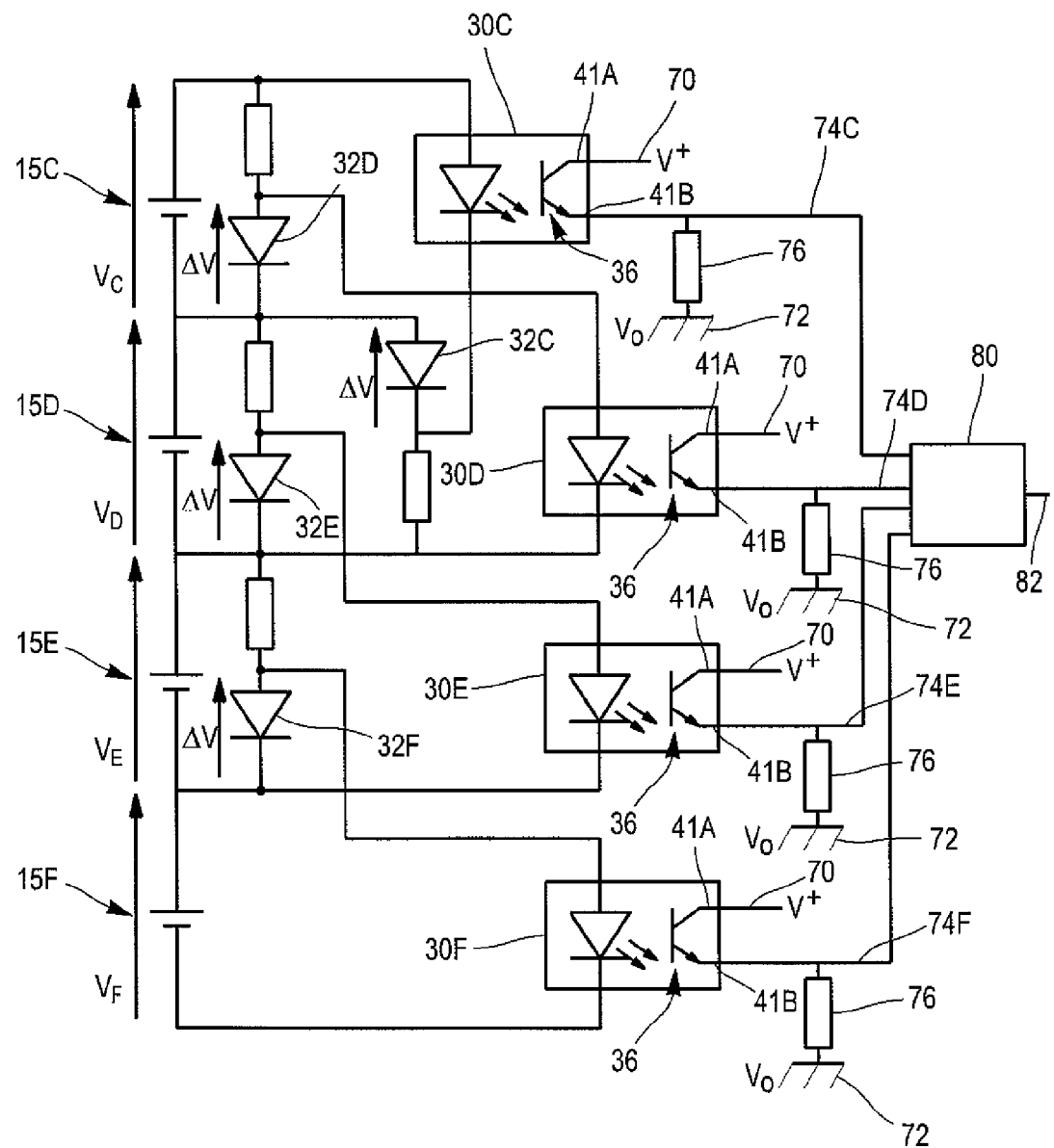

Other features and advantages of the invention will become apparent upon reading the description which follows, only given as an example and made with reference to the appended drawings, wherein:

FIG. 1 is a schematic sectional view of an electrochemical cell of a battery according to the invention, FIG. 2 is a schematic view of a first detail of an electric circuit for controlling the voltage of each cell of the battery according to the invention, FIG. 3 is a schematic view of a second detail of the electric circuit for controlling the voltage of each cell of the battery according to the invention, FIG. 4 is a schematic view of the electric circuit for controlling the voltage of each cell of the battery according to the invention, in a first alternative, and FIG. 5 is a schematic view of the electric circuit for controlling the voltage of each cell of the battery according to the invention, in a second alternative.

DETAILED DESCRIPTION

In the following, reference will be made to a fuel cell according to the invention, it being understood that the invention may also be applied to electric batteries.

A cell 15 of said fuel cell is illustrated in FIG. 1. It comprises a membrane-electrode assembly 16 inserted between an anode plate 18 and a cathode plate 22.

The membrane-electrode assembly 16 comprises an ion exchange membrane 26 sandwiched between an anode 28a and a cathode 28b.

The membrane 26 electrically insulates the anode 28a from the cathode 28b.

The membrane 26 is adapted for only letting through charged ions, preferably cations. The membrane 26 is generally a proton exchange membrane, adapted for only letting through protons. The membrane 26 is typically in a polymeric material.

The anode 28a and the cathode 28b each comprise a catalyst, typically platinum or a platinum alloy, for facilitating the reaction.

The anode plate 18 delimits an anode conduit 20 four circulating a reducing gas along the anode 28a and in contact with the latter. To do this, the plate 18 is provided with at least one channel made in the face of the plate turned towards the membrane-electrode assembly 16 and closed by said membrane-electrode assembly 16. The anode plate 18 is formed with an electrically conducting material, typically graphite. The reducing gas used is a gas comprising dihydrogen, such as for example pure dihydrogen.

The cathode plate 22 delimits a cathode conduit 24 for circulating an oxidizing gas along the cathode 28b and in contact with the latter. To do this, the plate 22 is provided with at least one channel made in the face of the plates turned towards the membrane-electrode assembly 16 and closed by said membrane-electrode assembly 16. The cathode plate 22 is formed with an electrically conducting material, typically graphite. The oxidizing gas used is a gas comprising dioxygen, such as for example pure dioxygen, air, or a restored mixture of dioxygen and of a neutral gas, such as nitrogen or carbon dioxide.

The membrane 26 separates the oxidizing and reducing gases. It is positioned between the anode plate 18 and the cathode plate 22 of the cell 15 and electrically insulates the latter from each other.

The anode 28a is in electric contact with the anode plate 18. The cathode 28b is in electric contact with the cathode plate 22. During operation of the fuel cell, an oxidation of the reducing gas occurs at the anode 28a, inducing the generation of electrons and protons. The electrons are then in transit via the anode plate 18 to the cathode 28b of the cell 15, or to the cathode of another cell, in order to participate in reduction of the oxidizing gas.

The cell 15 thus comprises two electric terminals: a negative electric terminal is formed by the anode plate 18, and a positive electric terminal is formed by the cathode plate 20.

The cell 15 is stacked with other similar cells, the anode plate 18 of each cell being in contact with the cathode plate 22 of the neighboring cell. The anode and cathode plates 18, 22 thus ensure the transfer of the electrons from the reducing gas circulating in a cell towards the oxidizing gas circulating in another cell. The anode 18 and cathode 22 plates of two neighboring cells of the stack are preferably made simultaneously in the same material and form together a bipolar plate.

With reference to FIGS. 2 and 3, the fuel cell comprises for each cell 15A, a device 30 four controlling the voltage at the terminals of said cell 15A. It further comprises a voltage regulator device 32, laid out so that the control device 30 measures the voltage $V_A$ at the terminals of the cell 15A, increased by a fixed offset voltage $\Delta V$.

The voltage $V_A$ is typically comprised between 0.5 and 1.0V, during normal operation of the cell 15A. The offset voltage $\Delta V$ is the voltage across the terminals of the regulator device 32. Preferably, the offset voltage $\Delta V$ is substantially equal to 0.3V.

The control device 30 is formed by an active optical device, typically an optocoupler. It comprises an input 34, electrically connected to the cell 15A, for measuring its voltage $V_A$, and an output 36, for constructing an image of the measured voltage $V_A$. The input 34 and the output 36 are electrically insulated.

The entry 34 comprises a light-emitting diode 38, adapted for emitting photons when the voltage on its terminals is greater than a threshold voltage $V_{min}$. During normal operation of the cell 15A, the threshold voltage $V_{min}$ is less than the sum of the voltages $V_A$ and $\Delta V$, so that the light-emitting diode 38 emits photons. The threshold voltage $V_{min}$ is typically comprised between 0.8 and 1.2V.

The output 36 comprises a phototransistor 40 adapted so as to be in a closed configuration, i.e. electrically connecting its collector 41A and its emitter 41B to each other, when its base 41C receives photons, and to be in an open configuration, i.e. electrically insulating its collector 41A and its emitter 41B from each other, when its base 41C does not receive any photons.

The phototransistor 40 is optically coupled with the light-emitting diode 38. In other words, the light-emitting diode 38 and the phototransistor 40 are laid down so that the photons emitted by the diode 38 reach the base 41C of the phototransistor 40. The passing of the phototransistor 40 from its open configuration to its closed configuration is thus controlled by the state of the light-emitting diode 38.

The regulator device 32 is a passive electric device. In particular, the regulator device 32 is a diode, typically a Schottky diode, advantageous because inexpensive and giving a fixed and easily controllable offset voltage. The diode is oriented in order to let through currents from high potential areas to low potential areas. Thus, when operating normally, the voltage across the terminals of the regulator device 32, which is also the offset voltage $\Delta V$, is equal to the threshold voltage of the diode.

The regulator device 32 comprises a first terminal 42, electrically connected to a terminal 44 of a cell 15B of the stack consecutive to the cell 15A. In other words, the first terminal 42 is connected to the bipolar plate forming the separation between the cells 15A and 15B. The first terminal 42 is in the director electric connection with the terminal 44, and to the cells 15A, 15B, i.e. there is no electric compound interposed between the terminals 42 and 44.

The regulator device 32 also comprises a second terminal 46, electrically connected to the other terminal 48 of the consecutive cell 15B. In other words, the second terminal 46 is electrically connected to the plate 18, 22 of the cell 15B opposite to the face of the cell 15B in contact with the cell 15A. A resistor 50 is inserted between the second terminal 46 and the terminal 48 in order to limit the intensity of the current flowing through the regulator device 32.

The input 34 of the control device 30 is connected to the second terminal 46 of the regulator device 32 on the one hand and to the terminal 52 of the cell 15A other than the common terminal 44.

In the example illustrated in FIG. 2, the common terminal 44 is the terminal of the cell 15A having the highest potential. The consecutive cell 15B is then an upper cell of the stack. The regulator device 32 is oriented so that its terminal 42 is its lowest potential terminal. Thus the voltage across the terminals of the input 34 is equal to the sum of the voltages $V_A$ and $\Delta V$.

In the example illustrated in FIG. 3, the common terminal 44 is the terminal of the cell 15A having the lowest potential. The consecutive cell 15B is then a lower cell of the stack. The regulator device 32 is oriented so that its terminal 42 is its highest potential terminal. Thus, the voltage across the terminals of the input 34 is equal to the sum of the voltages $V_A$ and $\Delta V$.

As the control device 30 measures the voltage $V_A$ of the cell 15A increased by the offset voltage $\Delta V$, the voltage $V_A$ may vary over a wider range before the voltage across the terminals of the input 34 of the control device 30 passes under the threshold voltage $V_{min}$. Untimely detections of dysfunction of the cell 15A are thereby avoided.

With reference to FIGS. 4 and 5, the fuel cell comprises four cells 15C, 15D, 15E, 15F connected in series with each other. It will be noted that this number of cells is only given as an example and that, in alternatives of the invention, the fuel cell comprises another number of cells, this number depending on the alternatives being greater or less than four.

The voltage $V_C$, $V_D$, $V_E$, $V_F$ of each cell 15C, 15D, 15E, 15F is measured by a control device, 30C, 30D, 30E, 30F respectively. In the same way as for the cell 15A illustrated in FIGS. 2 and 3, a regulator device, 32C, 32D, 32E, 32F respectively, is provided for each cell 15C, 15D, 15E, 15F, so that the associated control device 30C, 30D, 30E, 30F measures the voltage $V_C$, $V_D$, $V_E$, $V_F$ increased by an offset voltage $\Delta V$.

For each of the cells 15D, 15E, 15F, the cell consecutive to the terminals of which is connected the regulator device 32D, 32E, 32F, is formed by the upper consecutive cell, 15C, 15D, 15E respectively. For the cell 15C, the cell consecutive to the terminals of which is connected the regulator device 32C is formed of by the lower consecutive cell 15D.

In the alternative shown in FIG. 4, the outputs 36 of the control devices 30C, 30D, 30E, 30F are connected in series with each other, between a positive potential $V^+$ line 60 (typically 5 volts) and an output line 62. A resistor 64 is electrically interposed between the mine 62 and a reference potential $V_0$ line 66.

Thus, as long as all the phototransistors 40 of the control devices 30C, 30D, 30E, 30F are closed, the potential of the output line 62 is equal to the positive potential $V^+$. If on the other hand the potential of the output line 62 passes to the reference potential $V_0$, it is the sign that one of the phototransistors 40 has opened, and therefore that one of the cells 15C, 15D, 15E, 15F is subject to dysfunction.

In the alternative shown in FIG. 5, the outputs 36 of the control devices 30C, 30D, 30E, 30F are connected in parallel with each other, between a positive potential $V^+$ line 70 (typically 5 volts) and a reference potential $V_0$ line 72. In particular, each collector 41A is electrically connected to the line 70 and each emitter 41B is electrically connected to the line 72. Further, an output line 74C, 74D, 74E, 74F extends each emitter 41B. Finally, a resistor 76 is inserted between each emitter 41B and the line 72.

Preferably, a multiplexer 80 is provided for combining the signals of the different output lines 74C, 74D, 74E, 74F and for transmitting them via a single line 82.

Thus, as long as the phototransistor 40 of the control device 30C, 30D, 30E, 30F associated with an output line 74C, 74D, 74E, 74F, respectively is closed, the potential of said output line 74C, 74D, 74E, 74F is equal to the positive potential $V^+$. If on the other hand the potential of the output line 74C, 74D, 74E, 74F passes to the reference potential $V_0$, this is the sign that that the associated phototransistor 40 has opened, and therefore that the associated cell 15C, 15D, 15E, 15F respectively, is subject to dysfunction.

This embodiment allows more accurate control of the fuel cell by providing more detailed information than in the embodiment of FIG. 4, for a hardly higher cost.

In a third alternative of the invention (not shown), the outputs 36 of a first pair of control devices 30C, 30D, are connected in series with each other, and the outputs 36 of a second pair of control devices 30E, 30F are connected in series with each other, between a line with a positive potential $V^+$ and an output line. The output lines are connected in parallel with each other to a multiplexer, provided for combining the signals of the different output lines.

Thus, as long as the phototransistors 40 of the control devices 30C, 30D, 30E, 30F associated with an output line are closed, the potential of said output line is equal to the positive potential. If on the other hand the potential of the output line passes to the reference potential $V_0$, it is the sign that one of the associated phototransistors 40 has opened, and therefore that one of the associated cells 15C, 15D, 15E, 15F is subject to dysfunction.

It is therefore possible to identify dysfunctions at pairs of cells, without however being able to identify a dysfunction of each cell independently of the others, like in the embodiment of FIG. 5. This third alternative is advantageous in the case when the stack comprises a large number of cells.

It will be noted that, in the example of the third alternative given above, the control devices 30 are grouped pairwise, but the control devices 30 may be grouped batchwise each comprising more than two control devices 30, the number of control devices 30 within a same batch may vary from one batch to the other.

By means of the invention, it is therefore possible to control that the voltage across the terminals of each cell of the stack remains in the tolerated value range, reliably and at a lower cost.

What is claimed is:

1. A battery comprising:
a plurality of electrochemical cells connected in series with each other and adapted for each generating an electric current from an oxidation-reduction reaction between an oxidizing fluid and a reducing fluid;
a controller for each electrochemical cell for controlling the voltage across terminals of the respective cell; and
a voltage regulator for each electrochemical cell, distinct from the controller controlling the voltage across terminals of the respective cell and electrically connected to the respective cell so that said controller measures the voltage across the terminals of the respective cell, increased by an offset voltage across the terminals of the voltage regulator.

2. The battery as recited in claim 1 wherein the offset voltages are fixed.

3. The battery as recited in claim 1 wherein each voltage regulator is a passive device.

4. The battery as recited in claim 3 wherein the passive devices are diodes.

5. The battery as recited in claim 1 wherein each voltage regulator is electrically connected, through a first terminal, to a terminal of a consecutive cell of the battery, common with the cell whose voltage is measured, and, through a second terminal, to another terminal of the consecutive cell.

6. The battery as recited in claim 5 wherein the first terminal of each voltage regulator is in direct electric connection with the terminal common to the cell whose voltage is measured and to the consecutive cell.

7. The battery as recited in claim 5 wherein a resistor is electrically inserted between the second terminal of each voltage regulator and the terminal of the consecutive cell to which is connected the second terminal.

8. The battery as recited in claim 5 wherein each controller includes an input connected to a terminal of the respective cell whose voltage is measured on the one hand, and to the second terminal of the respective voltage regulator on the other hand.

9. The battery as recited in claim 1 each controller is an active optical element.

10. The battery as recited in claim 1 wherein each controller includes an output for constructing an image of the measured voltage, the outputs of at least two of the controllers being electrically connected in series with each other.

11. The battery as recited in claim 1 wherein each controller includes an output for constructing an image of the measured voltage, the outputs of at least two of the control devices being electrically connected in parallel with each other.

12. The battery as recited in claim 1 wherein the battery is a fuel cell.

* * * * *